United States Patent
Fachmann et al.

(10) Patent No.: US 12,424,501 B2
(45) Date of Patent: Sep. 23, 2025

(54) SEMICONDUCTOR PACKAGE INCLUDING A CHIP-SUBSTRATE COMPOSITE SEMICONDUCTOR DEVICE

(71) Applicant: Infineon Technologies Austria AG, Villach (AT)

(72) Inventors: Christian Fachmann, Villach (AT); Barbara Angela Glanzer, Klagenfurt am Wörthersee (AT); Andreas Riegler, Wernberg (AT)

(73) Assignee: Infineon Technologies Austria AG, Villach (AT)

( * ) Notice: Subject to any disclaimer, the term of this patent is extended or adjusted under 35 U.S.C. 154(b) by 440 days.

(21) Appl. No.: 18/099,290

(22) Filed: Jan. 20, 2023

(65) Prior Publication Data
US 2023/0238294 A1    Jul. 27, 2023

(30) Foreign Application Priority Data
Jan. 21, 2022 (EP) .................................. 22152677

(51) Int. Cl.
*H01L 23/14* (2006.01)
*H01L 21/48* (2006.01)
(Continued)

(52) U.S. Cl.
CPC .......... *H01L 23/142* (2013.01); *H01L 21/486* (2013.01); *H01L 21/76802* (2013.01);
(Continued)

(58) Field of Classification Search
CPC ................ H01L 23/142; H01L 21/486; H01L 21/76802; H01L 23/3114
See application file for complete search history.

(56) References Cited

U.S. PATENT DOCUMENTS 8,242,013 B2 * 8/2012 Feng ...................... H01L 24/92
257/E21.585
8,689,437 B2 * 4/2014 Dang ................... H01L 25/0657
29/829
(Continued)

FOREIGN PATENT DOCUMENTS

CN    102405524 A  *  4/2012  ......... H01L 21/4853
CN    113937086 A     1/2022
(Continued)

*Primary Examiner* — Laura M Menz
(74) *Attorney, Agent, or Firm* — Murphy, Bilak & Homiller, PLLC

(57) ABSTRACT

A high voltage semiconductor package includes a semiconductor device. The semiconductor device includes a high voltage semiconductor transistor chip having a front side and a backside. A low voltage load electrode and a control electrode are disposed on the front side of the semiconductor transistor chip. A high voltage load electrode is disposed on the backside of the semiconductor transistor chip. The semiconductor package further includes a dielectric inorganic substrate. The dielectric inorganic substrate includes a pattern of first metal structures running through the dielectric inorganic substrate and connected to the low voltage load electrode, and at least one second metal structure running through the dielectric inorganic substrate and connected to the control electrode. The front side of the semiconductor transistor chip is attached to the dielectric inorganic substrate by a wafer bond connection, and the dielectric inorganic substrate has a thickness of at least 50 μm.

15 Claims, 7 Drawing Sheets

(51) Int. Cl.
*H01L 21/768* (2006.01)
*H01L 23/31* (2006.01)
*H01L 23/498* (2006.01)
*H01L 23/528* (2006.01)

(52) U.S. Cl.
CPC .... *H01L 23/3114* (2013.01); *H01L 23/49838* (2013.01); *H01L 23/528* (2013.01)

(56) References Cited

U.S. PATENT DOCUMENTS

| | | | | |
|---|---|---|---|---|
| 9,425,131 | B2 * | 8/2016 | Chen | H01L 24/25 |
| 10,692,803 | B2 * | 6/2020 | Palm | H01L 23/3121 |
| 10,868,170 | B2 * | 12/2020 | Hutzler | H10D 62/112 |
| 11,342,248 | B2 * | 5/2022 | Mcknight-Macneil | H01L 23/5226 |
| 11,978,693 | B2 * | 5/2024 | Palm | H01L 21/568 |
| 12,288,738 | B2 * | 4/2025 | Park | H10D 62/8503 |
| 2011/0241214 | A1 * | 10/2011 | Feng | H01L 24/92 257/E21.585 |
| 2013/0228905 | A1 * | 9/2013 | von Koblinski | H01L 24/05 257/668 |
| 2015/0255380 | A1 * | 9/2015 | Chen | H01L 23/367 361/707 |
| 2018/0269146 | A1 * | 9/2018 | Palm | H01L 21/568 |
| 2019/0165160 | A1 * | 5/2019 | Hutzler | H10D 62/127 |
| 2022/0028699 | A1 * | 1/2022 | Fachmann | H01L 21/76802 |
| 2023/0238294 | A1 * | 7/2023 | Fachmann | H01L 23/49562 257/734 |
| 2023/0238333 | A1 * | 7/2023 | Fachmann | H01L 25/16 257/734 |
| 2024/0304690 | A1 * | 9/2024 | Sung | H10D 84/0167 |
| 2024/0405517 | A1 * | 12/2024 | Clarke | H02H 9/041 |
| 2024/0405518 | A1 * | 12/2024 | Clarke | H05K 1/0259 |
| 2024/0405519 | A1 * | 12/2024 | Clarke | H01T 1/02 |

FOREIGN PATENT DOCUMENTS

| | | | | |
|---|---|---|---|---|
| CN | 113964046 | A * | 1/2022 | H01L 21/463 |
| CN | 116487335 | A * | 7/2023 | H01L 23/15 |
| CN | 116487356 | A * | 7/2023 | H01L 21/4846 |
| DE | 102023209535 | A1 * | 4/2025 | H10D 30/0281 |
| EP | 2399288 | B1 | 8/2018 | |
| EP | 3944290 | A1 * | 1/2022 | H01L 21/463 |
| EP | 4216268 | A1 * | 7/2023 | H01L 23/15 |
| EP | 4216271 | A1 * | 7/2023 | H01L 21/4846 |
| JP | 2007095756 | A * | 4/2007 | |
| JP | 4761904 | B2 * | 8/2011 | |
| WO | WO-2010096213 | A2 * | 8/2010 | H01L 21/4853 |

\* cited by examiner

SEMICONDUCTOR PACKAGE INCLUDING A CHIP-SUBSTRATE COMPOSITE SEMICONDUCTOR DEVICE

TECHNICAL FIELD

This disclosure relates generally to the field of semiconductor devices, and in particular to the field of packaging semiconductor chips.

BACKGROUND

Semiconductor device manufacturers are constantly striving to increase the performance of their products, while decreasing their cost of manufacture. A cost and device performance sensitive area in the manufacture of a semiconductor device is packaging the semiconductor chip. Packaging involves, inter alia, forming an electrical interconnect from chip electrodes (die pads) to package terminals. The interconnect technology should provide for high electrical and thermal performance and reliability of the semiconductor device.

Packaging of high voltage (HV) semiconductor chips involves a number of specific problems. For example, the high-voltage edge of the chip is very sensitive, and any change in the vicinity of the high-voltage edge may adversely affect the edge termination of the chip. For example, there must be a relatively large distance between the semiconductor chip edge and a low-voltage terminal element (e.g., source terminal element or gate terminal element) that crosses the chip edge to allow lateral exit of field lines between the chip edge and the low-voltage terminal element.

Further aspects aim at cost efficient manufacturing processes and customer benefits in view of product versatileness and package mountability.

SUMMARY

According to an aspect of the disclosure a high voltage semiconductor package comprises a semiconductor device. The semiconductor device comprises a high voltage semiconductor transistor chip comprising a front side and a backside. A low voltage load electrode and a control electrode are disposed on the front side of the semiconductor transistor chip. A high voltage load electrode is disposed on the backside of the semiconductor transistor chip. The semiconductor package further comprises a dielectric inorganic substrate. The dielectric inorganic substrate comprises a pattern of first metal structures running through the dielectric inorganic substrate, wherein the pattern of first metal structures is connected to the low voltage load electrode, and at least one second metal structure running through the dielectric inorganic substrate, wherein the second metal structure is connected to the control electrode. The front side of the semiconductor transistor chip is attached to the dielectric inorganic substrate by a wafer bond connection, and the dielectric inorganic substrate has a thickness of at least 50 μm.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

As used in this specification, the terms "electrically connected" or "connected" or similar terms are not meant to mean that the elements are directly contacted together; intervening elements may be provided between the "electrically connected" or "connected" elements, respectively. However, in accordance with the disclosure, the above-mentioned and similar terms may, optionally, also have the specific meaning that the elements are directly contacted together, i.e. that no intervening elements are provided between the "electrically connected" or "connected" elements, respectively.

Further, the words "over" or "beneath" with regard to a part, element or material layer formed or located "over" or "beneath" a surface may be used herein to mean that the part, element or material layer be located (e.g. placed, formed, arranged, deposited, etc.) "directly on" or "directly under", e.g. in direct contact with, the implied surface. The word "over" or "beneath" used with regard to a part, element or material layer formed or located "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
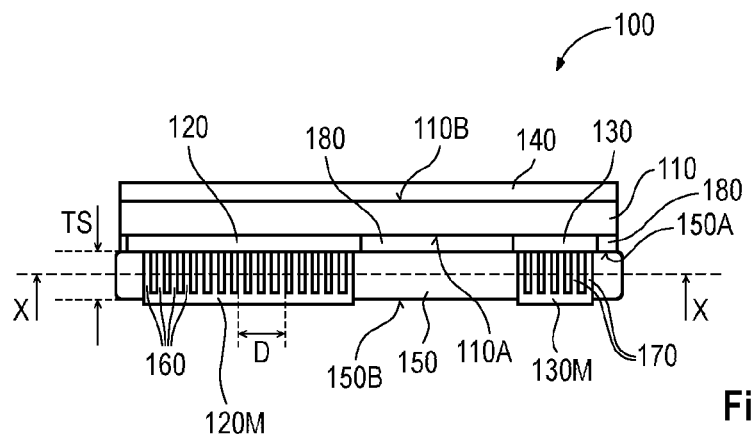
FIG. 1 is a schematic cross-sectional view of an exemplary semiconductor device comprising a semiconductor chip and a dielectric inorganic substrate in accordance with the disclosure.

FIG. 1 illustrates a schematic cross-sectional view of an exemplary semiconductor device 100. The semiconductor device 100 includes a semiconductor transistor chip 110. The semiconductor transistor chip 110 is a high voltage semiconductor transistor chip that operates at a supply voltage (e.g. drain voltage) equal to or higher than, e.g., 100 V, 200 V, 300 V, 400 V, 500 V, 600 V, 700 V, 800 V, 900 V, or 1000 V. In particular, the semiconductor transistor chip 110 may operate at a supply voltage in a range between 300 V and 800 V.

The semiconductor transistor chip 110 may be a vertical transistor device. The semiconductor transistor chip 110 has a front side 110A and a backside 110B. A low voltage load electrode 120 and a control electrode 130 are disposed on the front side 110A of the semiconductor transistor chip 110, and a high voltage load electrode 140 is disposed on the backside 110B of the semiconductor transistor chip 110.

The semiconductor transistor chip 110 may, e.g., be made of any semiconductor material, e.g. Si, SiC, SiGe, GaAs, GaN, AlGaN, InGaAs, InAlAs, etc. In particular, high voltage Si or SiC transistor chips 110 are considered herein.

A dielectric inorganic substrate 150 is attached to the front side 110A of the semiconductor transistor chip 110. More specifically, the front side 110A of the semiconductor transistor chip 110 is attached to a top surface 150A of the dielectric inorganic substrate 150 by a wafer bond connection 180. The front side 110A of the semiconductor transistor chip 110 may be completely covered by the dielectric inorganic substrate 150. In particular, the dielectric inorganic substrate 150 may be a glass substrate and the wafer bond connection 180 may, e.g., be a glass frit connection.

The dielectric inorganic substrate 150 comprises a pattern of first metal structures 160. The first metal structures 160 may be accommodated in recesses of the dielectric inorganic substrate 150. The first metal structures 160 run through the dielectric inorganic substrate 150, wherein the pattern of first metal structures 160 is connected to the low voltage load electrode 120.

The dielectric inorganic substrate 150 further comprises at least one second metal structure 170 running through the dielectric inorganic substrate 150. The second metal structure 170 is connected to the control electrode 130.

The first and second metal structures 160, 170 may be formed of plated metal pillars. To this end, before wafer bonding, recesses or through holes are formed in the dielectric inorganic substrate 150 and the first and second metal structures 160, 170 may be formed in the recesses or through holes of the dielectric inorganic substrate 150 by metal plating.

The dielectric inorganic substrate 150 may be a glass substrate or a semiconductor substrate. If the metal structures 160 are required to be electrically insulated from each other, glass or an intrinsic semiconductor substrate material or a semiconductor substrate having recesses with insulated side walls could be used. Recesses with insulated side walls may, e.g., be formed by applying an insulating layer (e.g. a silicon oxide layer or a silicon nitride layer) to the side walls of the recesses in which the first and second metal structures 160, 170 are accommodated.

The semiconductor device 100 may be referred to as a composite chip or substrate-semiconductor hetero-structure. Such composite chip may be diced out of a composite wafer which may comprise a semiconductor wafer and a dielectric inorganic substrate wafer bonded together by a wafer bond connection.

Such composite chips offer a number of advantages, especially for the packaging of high voltage transistor chips.

First, by integrating the permanent dielectric inorganic substrate 150 together with the semiconductor transistor chip 110 in a package, the dielectric inorganic substrate 150 may be used as an 'adaptor' that can be appropriately structured and metallized to make the composite chip directly solderable to a leadframe or application board or another terminal structure of a given geometry. For example, the first metal structures 160 may end in a substrate metallization 120M representing the low voltage load electrode 120 of the semiconductor device (composite chip) 100 and extending on a bottom surface 150B of the dielectric inorganic substrate 150. Accordingly, the one or more second metal structures 170 may end in a substrate metallization 130M which represents the control electrode 130 of the semiconductor device (composite chip) 100. As the substrate metallizations 120M and 130M are spaced apart (by the dielectric inorganic substrate 150) from the semiconductor transistor chip 110, constrains in terms of their geometries are substantially relaxed. For this and for other reasons, the geometries of the (low voltage) substrate metallizations 120M, 130M may be changed with regard to the geometries of the low voltage load electrode 120 and the control electrode 130, respectively.

In other words, the dielectric inorganic substrate 150 may be useful as a 'chip electrode layout adaptor' between the semiconductor transistor chip 110 and a terminal geometry provided internal (e.g. by a leadframe) or external (e.g. by an application board) of a high voltage semiconductor package which includes the semiconductor device 100. This allows direct bonding of the 'adapted' chip front side electrodes (namely the substrate metallizations 120M, 130M) to a terminal structure (e.g. leadframe) without requiring changes in chip processing when the terminal structure geometry (e.g. leadframe design) is modified. Further, such 'chip electrode layout adaptor' may be useful if already available chip types are to be packaged in a package using a given terminal structure (e.g. leadframe) geometry.

As a second aspect, the implementation of the dielectric inorganic substrate 150 allows to process very thin semiconductor wafers when being supported by the dielectric inorganic substrate wafer. Therefore, high voltage semiconductor transistor chips 110 with advanced electrical and thermal properties may be used.

Third, it is to be noted that in the case of high voltage semiconductor transistor chips 110, there needs to be a relatively large spacing between the front side 110A of the semiconductor transistor chip 110 and a low voltage connection element (e.g. low voltage load electrode connection element or control electrode connection element) that extends laterally across the edge of the semiconductor transistor chip 110. This spacing is required because the chip edge together with the backside 110B of the semiconductor transistor chip 110 is at a rapidly changing high voltage potential. For example, while the voltage fluctuations at the front side 110A of the semiconductor transistor chip 110 are, e.g., between 0.1-3 V at the low voltage load electrode and, e.g., between 0-20 V at the control electrode, the voltage fluctuations at the backside 100B and the edge of the semiconductor transistor chip 110 are between 0 V and e.g. 300 to 800 V or even 1000 V with a frequency of several 100 kHz. The relatively large spacing between the front side 110A of the semiconductor transistor chip 110 and low voltage connecting elements or terminals (e.g. leadframe or application board or conductor traces of a laminate) extending across the edge of the semiconductor transistor chip 110 allow the field lines to escape laterally between the low voltage connecting elements and the chip edge.

This distance is created by providing the dielectric inorganic substrate 150 with a sufficient thickness TS. Thus, the dielectric inorganic substrate 150 acts as an 'extension' to allow field lines to exit laterally between low voltage terminal elements and the chip edge. For example, the dielectric inorganic substrate 150 may have a thickness TS which may be equal to or greater than or less than 50 µm or 100 µm or 200 µm or 300 µm or 400 µm. While for SiC or other high bandgap semiconductor materials, a thickness TS of 50 µm may, e.g., be sufficient, Si semiconductor transistor chips 110 advantageously may use a dielectric inorganic substrate 150 of a thickness TS of equal to or greater than 100 µm.

The bottom surface 150B of the dielectric inorganic substrate 150 may be (highly) planar. The bottom surface 150B of the dielectric inorganic substrate 150 may be parallel with the backside 110B of the semiconductor transistor chip 110.

Figure 2A:
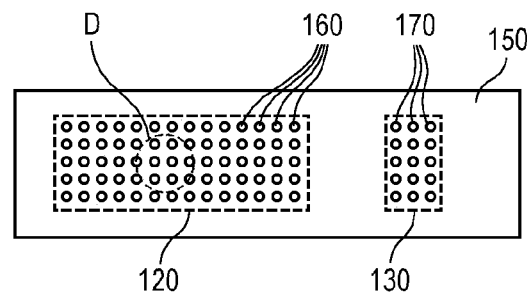
FIG. 2A is a cross-sectional view of the dielectric inorganic substrate along line X-X of FIG. 1.
Figure 2B:
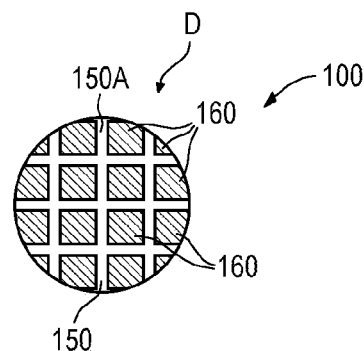
FIG. 2B is a partial view of a detail D of FIGS. 1 and 2A.

As apparent from FIGS. 2A and 2B, the first metal structures 160 may be arranged in a densely packed array in the dielectric inorganic substrate 150. Differently put, the dielectric inorganic substrate 150 may form a matrix for the pattern or array of first metal structures 160. The percentage in volume of metal within the pattern or array of the first metal structures 160 in the dielectric inorganic substrate 150 may be high, e.g. equal to or greater than, e.g., 40% or 50% or 60% or 70% or 80%.

The pattern of first metal structures 160 may, e.g., be a regular array. A pitch of the pattern of first metal structures 160 may, e.g., be equal to or greater than or less than 15 µm or 17.5 µm or 20 µm or 22.5 µm or 25 µm or 27.5 µm or 30 µm. A distance between adjacent first metal structures 160 may, e.g., be equal to or greater than or less than 50 µm or 30 µm or 10 µm or 5 µm or 4 µm or 3 µm or 2 µm. The lateral dimension(s) of each first metal structure 160 may, e.g., be equal to or greater than or less than 12.5 µm or 15 µm or 17.5 µm or 20 µm or 22.5 µm or 25 µm or 27.5 µm. A a ratio of a distance between adjacent first metal structures 160 and a lateral dimension (e.g. diameter) of a first metal structure 160 may be equal to or less than 5 or 3 or 2 or 1.

Referring to FIG. 2A, the dielectric inorganic substrate 150 may, e.g., have a polygonal, in particular rectangular shape.

By virtue of the dielectric inorganic substrate 150, the semiconductor device 110 may have advanced heat dissipation properties. Heat dissipation in semiconductor devices 100 relies, inter alia, on the electrical interconnect between the semiconductor transistor chip 110 and a terminal structure (e.g. leadframe or application board or conductor traces of a laminate, etc.) on which the semiconductor chip 110 is mounted. Here, this electrical interconnect includes or is composed of the pattern of first metal structures 160 in the dielectric inorganic substrate 150. The pattern of first metal structures 160 can be optimized in terms of thermal conductivity and/or heat capacity. The more densely the first metal structures 160 are packed in the dielectric inorganic substrate 150, the better the heat conductivity and the thermal capacity of the dielectric inorganic substrate 150. Further, enhancing the thickness TS of the dielectric inorganic structure 150 increases the thermal capacity thereof, because more metal is held available in the dielectric inorganic structure 150 for transient heat absorption.

The second metal structures 170 may be implemented the same way as described above for the first metal structures 160, and reiteration is avoided for the sake of brevity. However, as the second metal structure(s) 170 connect(s) to a low current control electrode, it is also possible that only a single second metal structure (i.e. a single metal pillar connecting between the control electrode 130 and the substrate metallization 130M of the control electrode) is sufficient.

Returning to FIG. 2B, the first metal structures 160 may, e.g., have a polygonal (square, hexagonal, etc.) or rounded cross-section. A square cross-sectional shape is exemplarily shown in FIG. 2B, while FIG. 2A illustrates for example a rounded cross-sectional shape. A hexagonal cross-sectional shape may be beneficial as it provides for a particular high area packing density of metal in the dielectric inorganic structure 150.

Each first metal structure 160 may be linear and/or have an axially symmetric cross-sectional shape. Furthermore, each first metal structure 160 may, e.g., have a substantially constant cross-sectional shape along its extension through the dielectric inorganic substrate 150. Variable-cross sectional shapes along the longitudinal extension such as, e.g., tapering shapes or bulges or thickenings are also possible.

Moreover, the pattern does not need to be designed as a regular array. Rather, the pattern may be composed of a plurality of different patterns or (e.g. regular) arrays. Such different patterns (e.g. sub-patterns) or arrays (e.g. sub-arrays) may distinguish from each other e.g. in terms of pitch and/or cross-sectional shape of the first metal structures 160.

Figure 3:
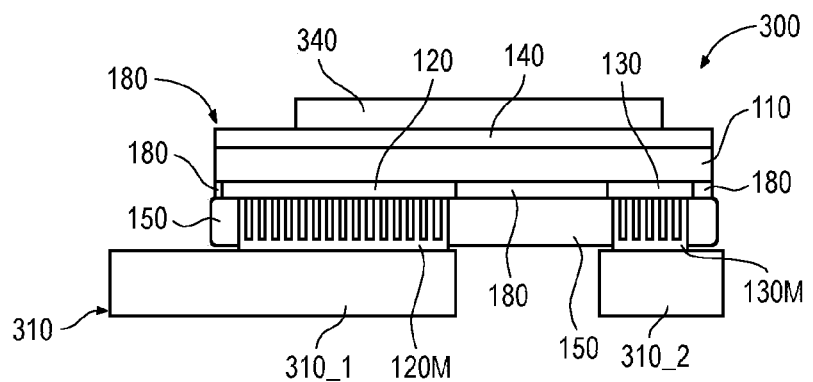
FIG. 3 is a schematic cross-sectional view of an exemplary leadframe package including a semiconductor chip and a dielectric inorganic substrate in accordance with the disclosure.

FIG. 3 illustrates an example of a leadframe package 300. The leadframe package 300 includes a leadframe 310 having a first leadframe pad 310_1 and a second leadframe pad 310_2. A semiconductor device 100, as described above, is bonded to the leadframe 310. More specifically, the pattern of first metal structures 160 is bonded to the first leadframe pad 310_1 and the at least one second metal structure 170 is bonded to the second leadframe pad 310_2.

As shown in FIG. 3, the leadframe package 300 relies on a low voltage electrode-down approach. In the following, without loss of generality, the low voltage load electrode 120 is exemplified by the source electrode of the semiconductor transistor chip 110 and the control electrode 130 is exemplified by the gate electrode of the semiconductor transistor chip 110. Hence, the low voltage electrode-down approach is referred to as a source-down approach in the following.

The source-down approach of the leadframe package 300 solves another problem of high voltage applications. Conventionally the heat sink is always coupled to the drain (here the backside high voltage load electrode 140). In this case, the heat sink must be constantly charged or discharged or, if the heat sink is capacitively coupled to the drain 140, losses occur due to the capacitive coupling. Both these types of losses (charge/discharge losses or capacitive losses) with regard to the heat sink and further high frequency electro magnetic interference (EMI) behavior, which inevitably occurs due the large area of the drain 140 electrode, are major disadvantages for high voltage leadframe packages.

With the source-down approach of FIG. 3, these problems are solved. This is because the semiconductor transistor chip 110 has its source connected to the lead frame 310 via the dielectric inorganic substrate extension 150, and thus also to the heat sink. As mentioned before, the source is always at a low potential, i.e. does not constantly fluctuate between zero and high voltage.

The leadframe package 300 may include a package body formed of a molded encapsulation material (not shown). Further, the leadframe package 300 may include an electrically conductive element 340 bonded to the high voltage load electrode (e.g. drain electrode) 140. The electrically conductive element 340 may, e.g., be a clip or a ribbon or a plurality of bond wires which connect to a high voltage terminal (not shown) of the high voltage leadframe package 300.

Figure 4:
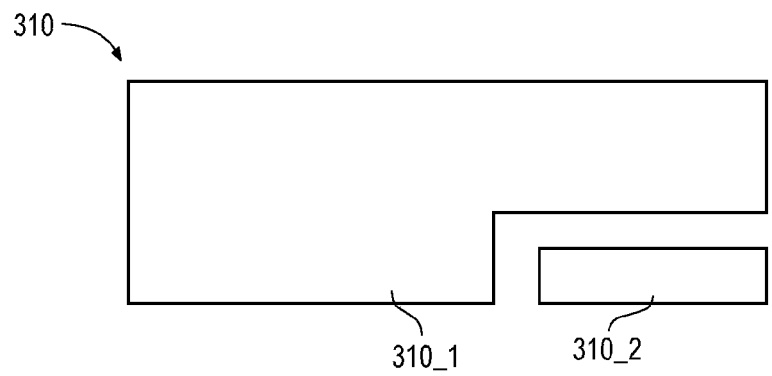
FIG. 4 is a top view of an exemplary leadframe of FIG. 3.

As noted above, the leadframe 310 can have a variety of different geometries (e.g., see FIG. 4 for a specific example) that can be easily modified due to the geometric adaptability provided by the dielectric inorganic substrate 150.

Figure 5:
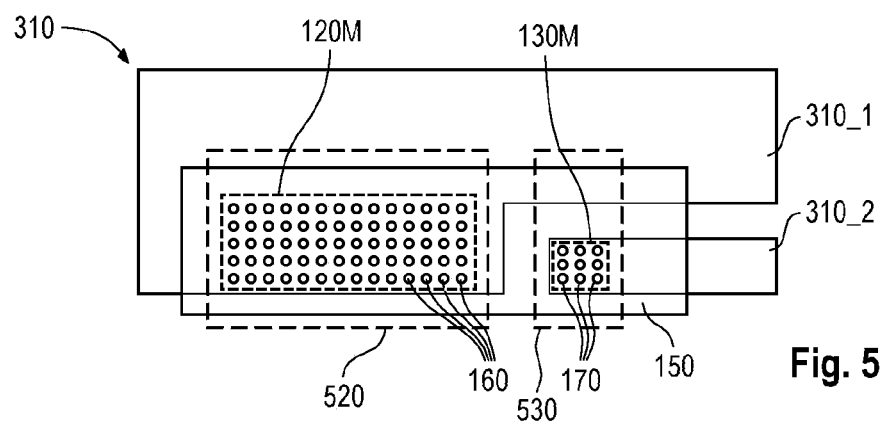
FIG. 5 is a top view illustrating the cross-sectional view of the dielectric inorganic substrate of FIG. 2A when positioned over the leadframe.

FIG. 5 illustrates an exemplary position of the dielectric inorganic substrate 150 over the leadframe 310 in a top view representation. The outline of the low voltage load electrode 120 (e.g. source electrode) is indicated by dashed line 520 and the outline of the control electrode 130 is indicated by dashed line 530. It is apparent that the dielectric inorganic substrate 150 allows to use a leadframe geometry which could not be used if the leadframe 310 would be directly soldered to the semiconductor transistor chip 110. Further, as the first leadframe pad 310_1 represents the thermal pad of the leadframe 310, the source-down approach of FIGS. 3 to 5 allows to contact the low voltage load electrode 120 via the first metal structures 160 with high thermal conductivity to a heat sink (namely the first leadframe pad 310_1) without charging/discharging or capacitive losses and improved EMI behavior.

Figure 6:
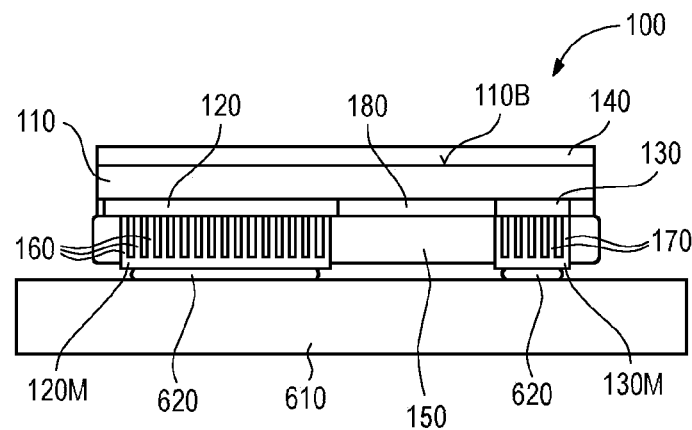
FIG. 6 is a schematic cross-sectional view of an exemplary on-board assembly of a semiconductor chip and a dielectric inorganic substrate in accordance with the disclosure.

Referring to FIG. 6, the semiconductor device 100 may be directly mounted (e.g. soldered) to an application board 610. More specifically, the low voltage load electrode substrate metallization 120M and the control electrode substrate metallization 130M may be electrically and mechanically fixed by a bond material 620 (e.g. solder, conductive adhesive, sinter material, . . . ) to conductor traces (not shown) provided on the application board 610.

Analogously as described above, the semiconductor device 100 may be packaged by using e.g. an electrically conductive element 340 (not shown in FIG. 6) and/or a molded encapsulant. Reference is made to the above description to avoid reiteration.

Figure 7:
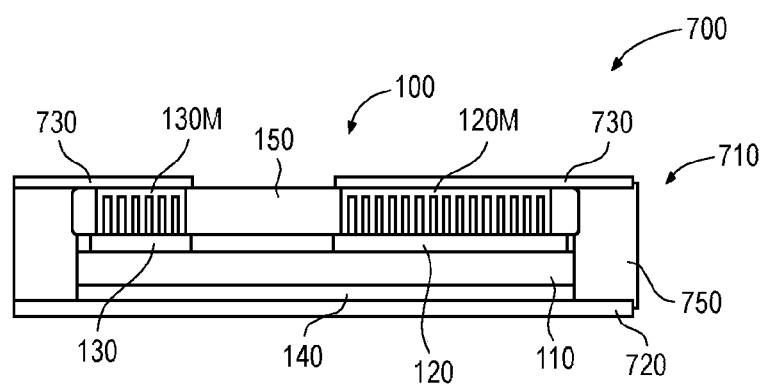
FIG. 7 is a schematic cross-sectional view of an example of a laminate embedded chip package including a semiconductor chip and a dielectric inorganic substrate in accordance with the disclosure.

FIG. 7 illustrates an example of a laminate embedded chip package 700. The laminate embedded chip package 700 includes a laminate structure 710 for semiconductor device embedding. The semiconductor device 100 is embedded in the laminate structure 710.

The laminate structure 710 may, e.g., be a printed circuit board (PCB). A PCB may include conductive layers 720, 730 spaced apart by a laminate layer 750. The laminate layer 750 provides for electrical insulation and mechanical support of the conductive layers 720, 730. The conductive layers 720, 730 may be structured (see conductive layer 730) or unstructured. Dielectric composite materials containing a matrix (e.g. of epoxy or polyester) and a reinforcement structure (e.g. glass fibers or other filler materials such as, e.g., ceramics) may be used as a laminate structure 710. The laminate structure 710 may, e.g., be a FR-4 PCB.

The laminate embedded chip package 700 may be formed by a variety of laminate and chip embedding processes. For example, the laminate structure 710 may be formed by a PCB, which is recessed, and the semiconductor device 100 is then placed into the recess.

Another possibility is to first place the semiconductor device 100 (composite chip) on a base carrier represented in FIG. 7 by the conductive layer 720. This base carrier may be a metal plate or a leadframe. The semiconductor device 100 may be bonded to this base carrier by known techniques such as using printable conductive pastes or soldering. Following the process of bonding the semiconductor device 100 to the base carrier (e.g. conductive layer 720), the laminate layer 750 may be vacuum laminated on the base carrier. In other words, the semiconductor device 100 bonded to a leadframe (e.g. a structured or unstructured metal plate of a thickness of, e.g., equal to or greater than 150 μm) is subjected to a lamination process for packaging. Subsequently to the lamination, via contacts (not shown) to the base carrier 720 and to the substrate metallizations 120M, 130M may be formed to electrically connect the semiconductor device 100 to external terminals.

Figure 8:
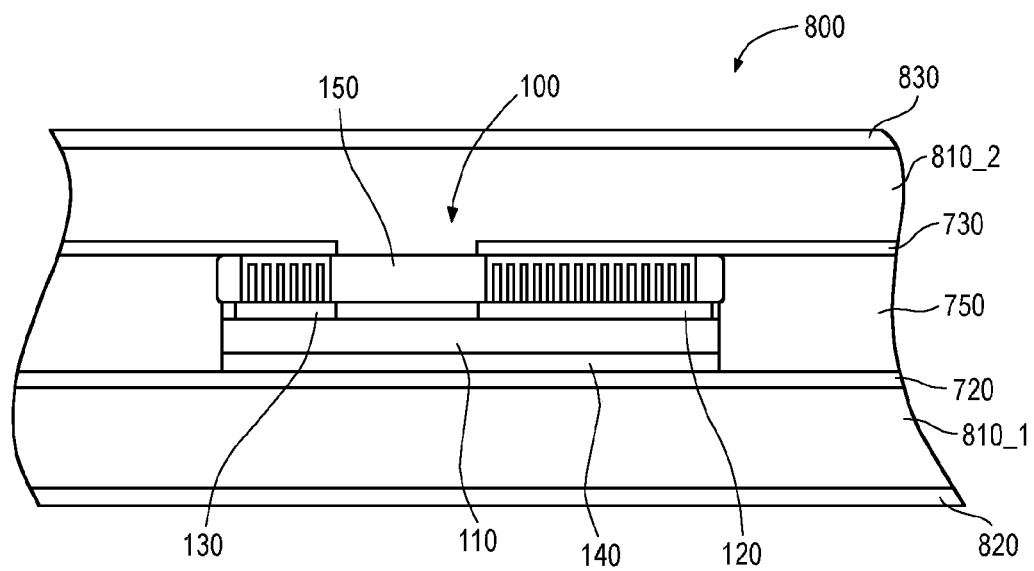
FIG. 8 is a schematic cross-sectional view of an example of a laminate embedded chip package including a semiconductor chip and a dielectric inorganic substrate in accordance with the disclosure.

FIG. 8 illustrates an example of a further laminate embedded chip package 800. In this example, the laminate structure 710 is a core laminate structure of the embedded chip package 800. The laminate embedded chip package 800 further comprises a bottom laminate structure 810_1 extending below the core laminate structure 710 and the semiconductor device 100. Alternatively or in addition, the laminate embedded chip package 800 may be provided with a top laminate structure 810_2 extending above the core laminate structure 710 and the semiconductor device 100. Further, conductive layers 820 and/or 830 may be provided on the bottom laminate structure 810_1 and/or the top laminate structure 810_2. These conductive layers 820, 830 may be structured or unstructured and may be electrically connected by vias (not shown) extending through the bottom laminate structure 810_1 and/or the top laminate structure 810_2 to the conductive layers 720 or 730, respectively, in order to electrically connect the semiconductor device 100 to external circuitry. Here, e.g. the structured conductive layer 730 forms electrical contacts to the semiconductor device 100 which are disconnected from each other and embedded in dielectric material (laminate layer 750 and top laminate structure 810_2). Further, as described above for laminate embedded chip package 700, also in laminate embedded chip package 800 the semiconductor device 100 can be pre-bonded to a (structured or unstructured) leadframe (instead of conductive layer 720) and then accommodated in the laminate embedded chip package 800 by combined semiconductor device 100 and leadframe lamination. The (structured or unstructured) leadframe or the conductive layer 720 and/or the conductive layer 730 may have a thickness of, e.g., equal to or greater than 150 μm.

Laminate embedded chip packages 700, 800 also make use of the spacer functionality of the dielectric inorganic substrate 150. The dielectric inorganic substrate 150 guarantees for a sufficient spacing between the chip edge and the conductive layer 730 extending across the chip edge. Without the dielectric inorganic substrate 150 this spacing would need to be provided by other means, e.g. by a relatively thick laminate spacing layer applied instead of the dielectric inorganic substrate 150. However, such thick laminate spacing layers cause difficulties in the embedding process. It is much more convenient in view of process and device reliability to use the semiconductor transistor chip 110 with the pre-mounted dielectric inorganic substrate spacer as an object to be laminated. Hence, the 'composite chip' approach applied to chip embedding in laminate chip packages makes the manufacturing process of such HV packages much easier and more reliable.

Figure 9:
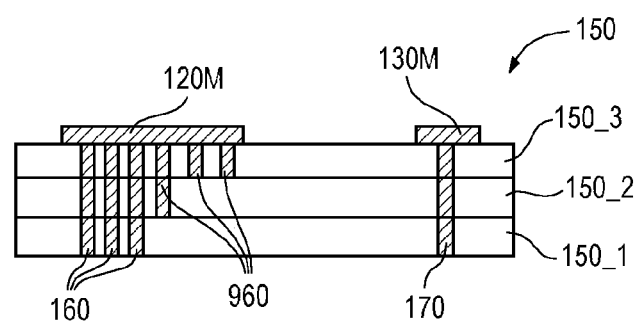
FIG. 9 is a schematic cross-sectional view of a dielectric inorganic substrate 150 including a plurality of stacked dielectric inorganic substrate layers.

Referring to FIG. 9, the dielectric inorganic substrate 150 may comprise or be composed of a plurality of stacked dielectric inorganic substrate layers 150_1, 150_2, 150_3. Each dielectric inorganic substrate layer 150_1, 150_2, 150_3 may be constructed the same way as described for the dielectric inorganic substrate 150. Implementing the dielectric inorganic substrate 150 by a multi-layer structure, as shown in FIG. 9, may facilitate the process of manufacturing thick dielectric inorganic substrates 150, since recess formation and metal plating can be carried out more conveniently with thinner structures, namely the layers 150_1, 150_2 and 150_3. For instance, if a thickness TS of 300 μm is desired, each of these processes need only to be carried out on a dielectric inorganic substrate layer 150_1, 150_2, 150_3 of a thickness of, e.g., 50 μm or 100 μm.

The dielectric inorganic substrate layers 150_1, 150_2, 150_3 including the first and second metal structures 160, 170 may be pre-fabricated and then aligned and bonded together to form the dielectric inorganic substrate 150. As noted before, layer bonding may be done on wafer-level e.g. by using a glass frit connection between adjacent dielectric inorganic substrate layers 150_1, 150_2 and 150_3.

Further, this technique of stacking a plurality of dielectric inorganic substrate layers 150_1, 150_2, 150_3 allows to form third metal structures 960 which do not extend through the dielectric inorganic substrate 150 but end in the dielectric inorganic substrate 150 at a dielectric inorganic substrate layer 150_1, 150_2 adjacent to the dielectric inorganic substrate layer 150_2, 150_3 which is provided with the third metal structure 960. Such third metal structures 960 can be used as field plates (e.g. source field plates) which allow to appropriately effect the electrical field above the semiconductor transistor chip 110. Due to the layer-by-layer arrangement of the dielectric inorganic substrate 150, no blind holes need to be fabricated to realize such third metal structures 960 terminating in the dielectric inorganic substrate 150.

FIGS. 10A-10L illustrate exemplary stages of a process of manufacturing a semiconductor device 100 in accordance with the disclosure.

Figure 10A:
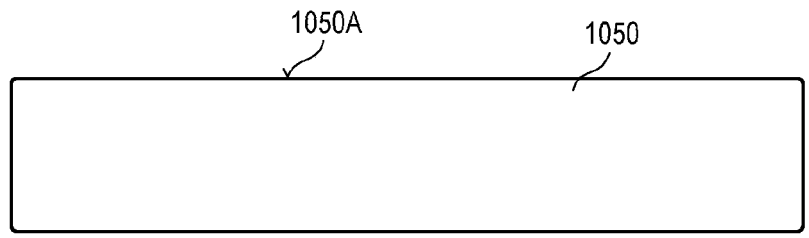
FIGS. 10A-10L are schematic cross-sectional views illustrating exemplary stages of manufacturing an exemplary semiconductor device in accordance with the disclosure.

Referring to FIG. 10A, a dielectric inorganic substrate wafer 1050 is provided. The dielectric inorganic substrate wafer 1050 may, e.g., have a thickness of 300 to 1100 μm, in particular 400 to 700 μm. The dielectric inorganic substrate wafer 1050 may, e.g., be a glass wafer or a semiconductor wafer. FIGS. 1000A-L illustrate only a portion of the dielectric inorganic substrate wafer 1050 which comprises, e.g., one semiconductor chip 110, see FIG. 10L.

Figure 10B:
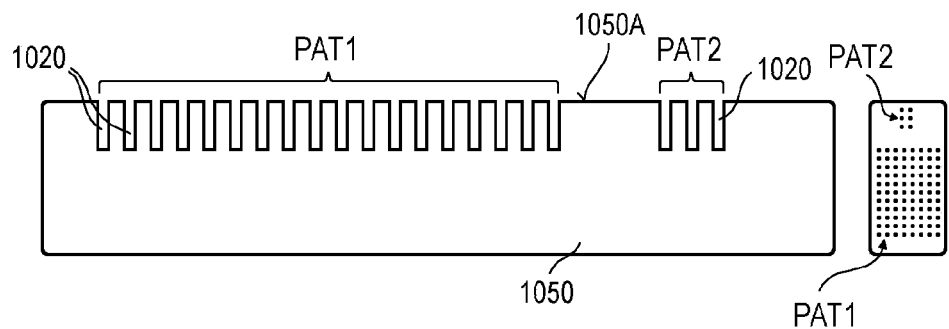

FIG. 10B illustrates the formation of recesses 1020 in a top surface 1050A of the dielectric inorganic substrate wafer 1050. The recesses 1020 may be formed by etching. The dimensions (lateral dimensions, depths) of the recesses 1020 may correspond to the dimensions described above for the first metal structures 160.

According to FIG. 10B, the dielectric inorganic substrate wafer 1050 may include (per chip) a first pattern PAT1 of recesses 1020 and a second pattern PAT2 of the recesses 1020. As shown on the right hand side of FIG. 10B which illustrates a top view on a chip portion of the dielectric inorganic substrate wafer 1050, the area of PAT1 may, e.g., be substantially greater than the area of PAT2. Further, as mentioned before, the parameters (pitch, distance, shape, . . . ) of the recesses 1020 in PAT1 and in PAT2 may be different from each other or may be the same.

In one embodiment, only the first pattern PAT1 is formed as a pattern of recesses, while the second pattern PAT2 is replaced by another type of through connection such as, e.g., a single hole serving as a through connection for, e.g., the control electrode 130 of the semiconductor transistor chip 110.

Some of the recesses 1020 formed in the dielectric inorganic substrate wafer 1050 may have a depth which is smaller than the target thickness of the dielectric inorganic substrate wafer 1050 (i.e. TS of FIG. 1), while other recesses 1020 have a depth greater than the target thickness of the dielectric inorganic substrate wafer 1050.

Figure 10C:
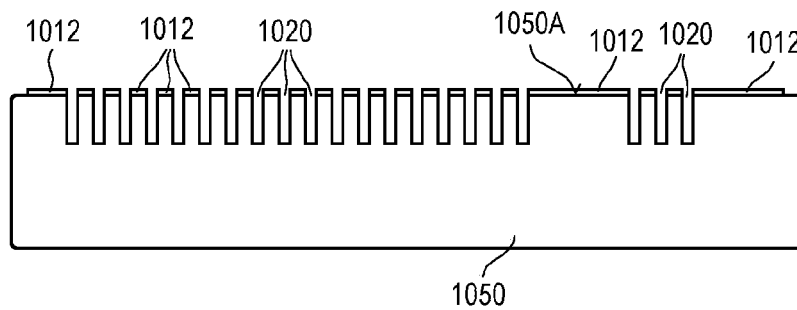

Referring to FIG. 10C, a liner 1012 may optionally be deposited over the top surface 1050A of the dielectric inorganic substrate wafer 1050. The liner 1012 may, e.g., be an electrically conductive seed layer.

Figure 10D:
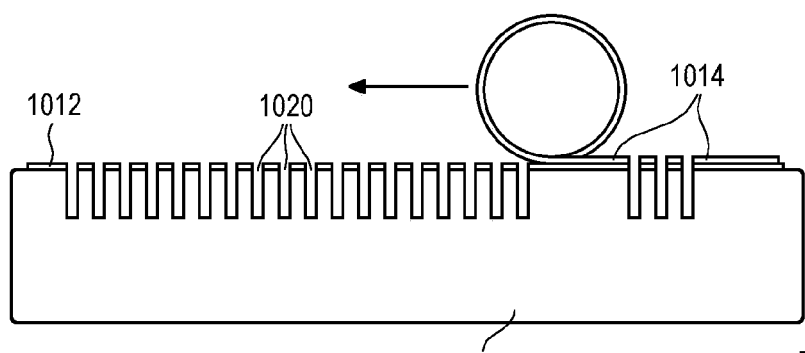
Figure 10E:
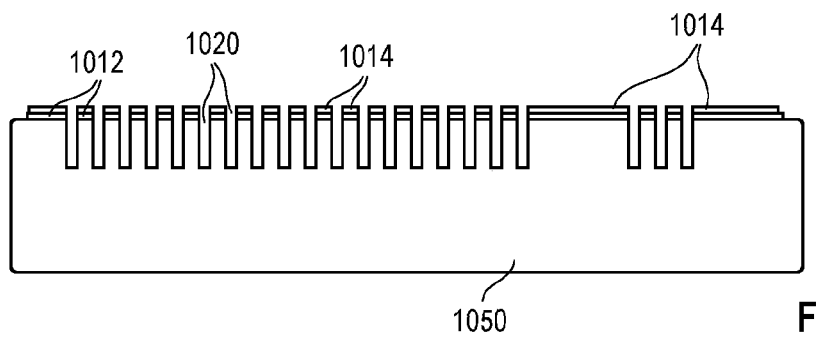

Referring to FIG. 10D, a protective layer 1014 may be applied over the top surface of the dielectric inorganic substrate wafer 1050 and, e.g., over the liner 1012. The protective layer 1014 may be applied using a self-aligned process. That is, the protective layer 1014 may only be applied over parts of the top surface 1050A of the dielectric inorganic substrate wafer 1050 which are not recessed. The protective layer 1014 may, e.g., be applied by a rolling and/or printing process and may, e.g., completely cover the liner 1012 at non-recessed parts of the top surface 1050A of the dielectric inorganic substrate wafer 1050. FIG. 10E shows the protective layer 1014 applied over the top surface of the dielectric inorganic substrate wafer 1050.

It is to be noted that the processes of liner 1012 deposition and/or protective layer 1014 deposition as shown in FIGS. 10C and 10D are optional processes, since metal plating, as described in the following, can also be carried out without liner 1012 and/or protective layer 1014 deposition.

Figure 10F:
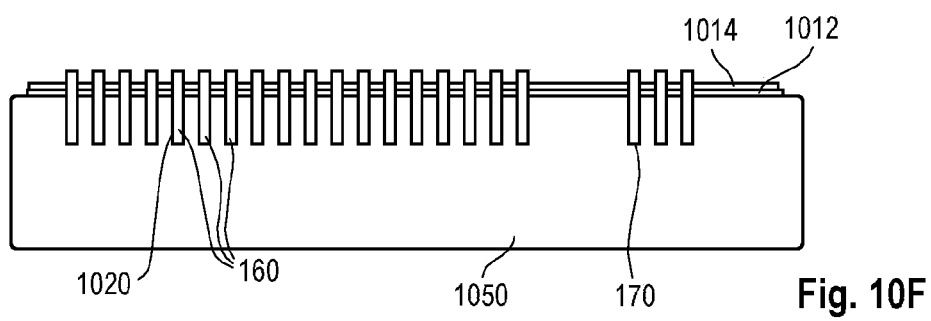

Referring to FIG. 10F, metal is plated to fill the recesses 1020. As a result, the first metal structures 160 are formed. The first metal structures 160 may completely fill the recesses 1020. Further, the second metal structures 170 may be formed.

The first metal structures 160 may protrude a small distance over the top surface 1050A of the dielectric inorganic substrate wafer 1050. Metal plating can be carried out by electro-chemical deposition (ECD). For instance, copper or a copper alloy may be used as a plating metal, but other metals known in the art to be suitable for package interconnects can also be used. The same may hold true for the second metal structure(s) 170.

Figure 10G:
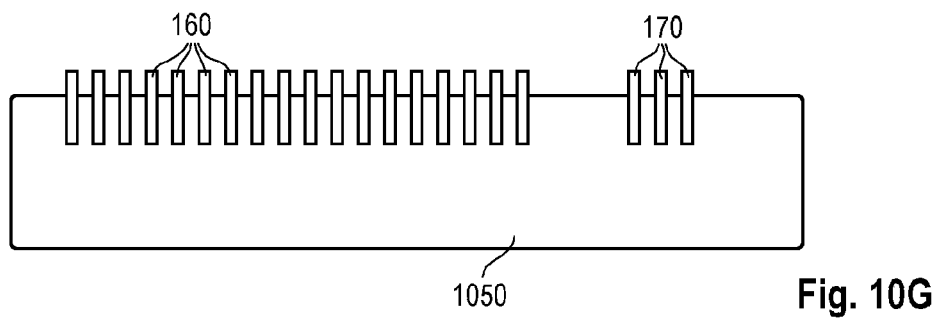

Referring to FIG. 10G, the protective layer 1014 (if present) and the liner 1012 (if present) are removed by, e.g., etching.

Figure 10H:
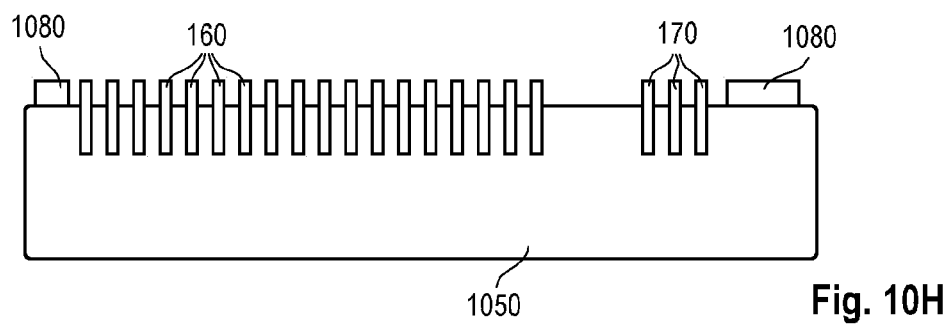

Referring to FIG. 10H, a bonding material 1080 may be applied on the dielectric inorganic substrate wafer 1050. The bonding material 1080 may be applied on areas of the dielectric inorganic substrate wafer 1050 which correspond to inactive areas of a semiconductor wafer 1010 (see FIG. 10I).

Figure 10I:
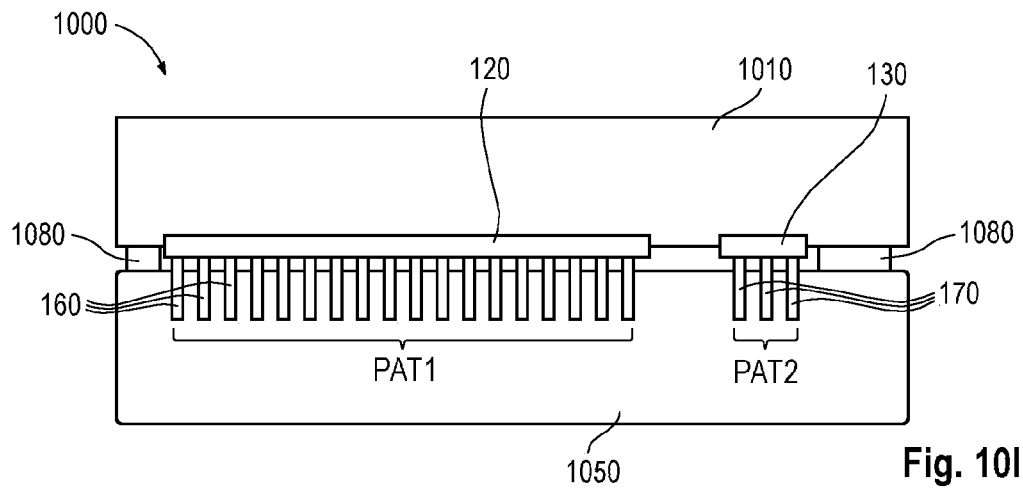

The bonding material 1080 may e.g. comprise or be glass glue (e.g. glass frit) or a resin or any other material suitable to permanently bond the dielectric inorganic substrate wafer 1050 to the semiconductor wafer 1010 (see FIG. 10I).

Referring to FIG. 10I, the front side of a semiconductor wafer 1010 is combined with the dielectric inorganic substrate wafer 1050 to form a composite wafer 1000. During this process the plurality of patterns of first metal structures 160 is placed opposite the plurality of low voltage load electrodes 120 on the semiconductor wafer 1010. Again, it is to be noted that FIG. 10I only shows a partial view of the dielectric inorganic substrate wafer 1050 and the semiconductor wafer 1010 which substantially corresponds to one semiconductor transistor chip 110 in the semiconductor wafer 1010. Hence, the first pattern PAT1 of first metal structures 160 and the second pattern PAT2 of second metal structures 170 may form sub-patterns corresponding to two electrodes 120, 130 of a single semiconductor transistor chip 110 of the semiconductor wafer 1010.

The process of combining the semiconductor wafer 1010 and the dielectric inorganic substrate wafer 1050 as shown in FIG. 10I may be carried out by using optical alignment through the dielectric inorganic substrate wafer 1050 (e.g. so-called through-glass alignment or through-semiconductor alignment). That is, an optical alignment processes may be carried out by viewing through the dielectric inorganic substrate wafer 1050 to recognize the position of the semiconductor wafer 1010 relative to the position of the dielectric inorganic substrate wafer 1050 so as to combine the semiconductor wafer 1010 and the dielectric inorganic substrate wafer 1050 in proper alignment.

The bonding material 1080 may have also been applied to the semiconductor wafer 1010 rather than to the dielectric inorganic substrate wafer 1050.

Figure 10J:
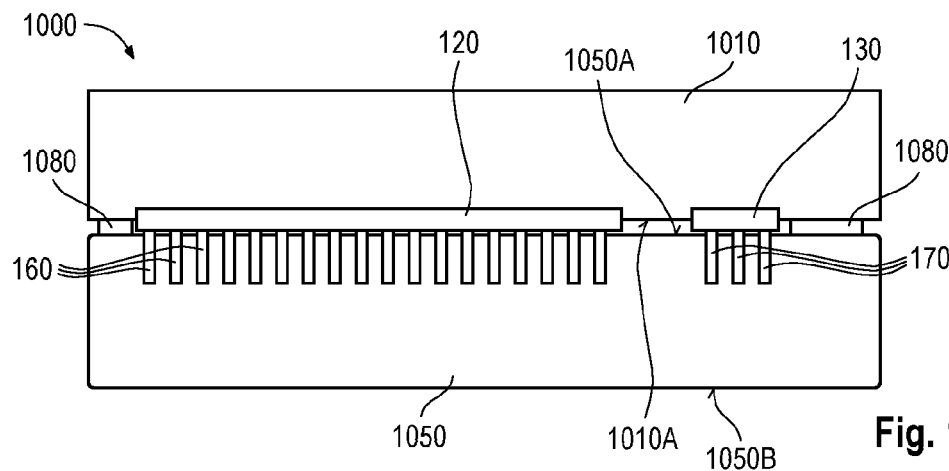

FIG. 10J illustrates the process of bonding the semiconductor wafer 1010 to the dielectric inorganic substrate wafer 1050 with the front side 1010A of the semiconductor wafer 1010 facing the dielectric inorganic substrate wafer 1050. This process may concurrently connect the plurality of patterns of first metal structures 160 on the dielectric inorganic substrate wafer 1050 to the plurality of low voltage load electrodes 120 on the semiconductor wafer 1010. The process may be carried out by applying heat and pressure to the composite wafer 1000.

By virtue of this process the bonding 1080 material fixedly secures the semiconductor wafer 1010 to the dielectric inorganic substrate wafer 1050. Further, by this or another process, the first metal structures 160 may be electrically and mechanically fixedly connected to the low voltage load electrodes 120. The connections may be solder-free, i.e. no solder material may be used for establishing the electrical, mechanical and thermal connection between the low voltage load electrodes 120 and the first metal structures 160. By way of example, the connection may be created by the formation of an eutectic phase between the metal of the low voltage load electrodes 120 and the metal of the first metal structures 160. The same may hold true for the connection of the second metal structures 170 to the control electrodes 130.

Figure 10K:
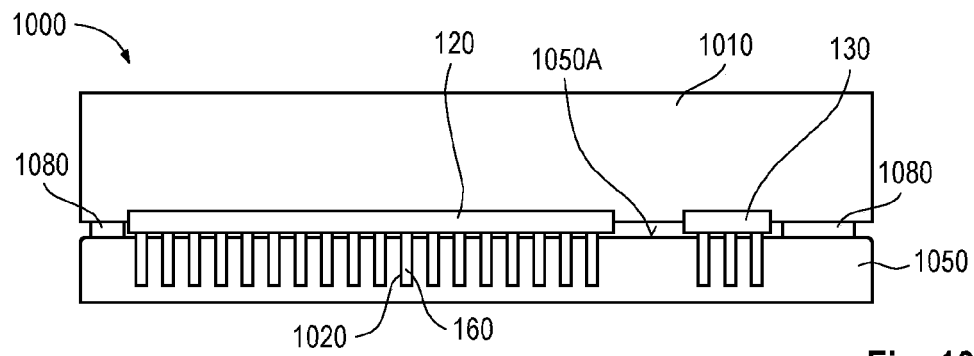
Figure 10L:
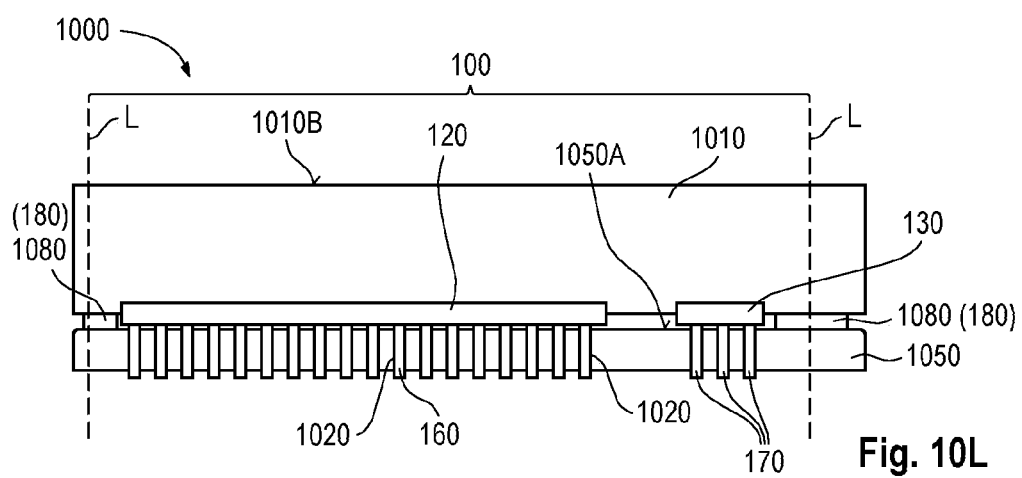

Referring to FIGS. 10K and 10L, the dielectric inorganic substrate wafer 1050 may be thinned from a bottom surface 1050B (see FIG. 10J) opposite the top surface 1050A to expose the metal of at least a part or of all of the metal structures 160 in the recesses 1020.

More specifically, thinning may, e.g., be carried out in a multi-stage process. For instance, as shown in FIG. 10K, thinning may comprise grinding the dielectric inorganic substrate wafer 1050 down to a thickness which is only slightly larger than the depth of the recesses 1020. For instance, grinding may stop at a distance of equal to or less than 20 µm or 15 µm or 10 µm over the bottom of the recesses 1020.

The first metal structures 160 or at least a part of them may then be exposed by etching the dielectric inorganic substrate wafer 1050 down to the thickness TS (see FIG. 1). Etching may be carried out by wet or dry chemical etching. Etching may be continued until the first metal structures 160 (or at least some of them) and e.g. also the second metal structures 170 protrude a small distance such as, e.g., a few µm over the bottom surface of the thinned dielectric inorganic substrate wafer 1050. The bottom surface of the thinned dielectric inorganic substrate wafer 1050 may correspond to the bottom surface 150B of the dielectric inorganic substrate 150 as shown in FIG. 1.

In the following, the back-end-of-line (BEOL) processes of chip packaging may be carried out on the composite wafer 1000 shown in FIG. 10L. In this context, the composite wafer 1000 is separated along dicing lines L into composite chips corresponding to semiconductor devices 100. Separating the composite wafer 1000 into composite chips may be carried out by any suitable dicing methods, e.g. mechanical sawing, laser dicing and/or etching. As a result, the high voltage semiconductor transistor chip 110 and the dielectric inorganic substrate 150 may have aligned cutting edges.

The following examples pertain to further aspects of the disclosure:

Example 1 is a high voltage semiconductor package, comprising a semiconductor device comprising a high voltage semiconductor transistor chip comprising a front side and a backside, wherein a low voltage load electrode and a control electrode are disposed on the front side of the semiconductor transistor chip and a high voltage load electrode is disposed on the backside of the semiconductor transistor chip; a dielectric inorganic substrate comprising a pattern of first metal structures running through the dielectric inorganic substrate, wherein the pattern of first metal structures is connected to the low voltage load electrode; and at least one second metal structure running through the dielectric inorganic substrate, wherein the second metal structure is connected to the control electrode; wherein the front side of the semiconductor transistor chip is attached to the dielectric inorganic substrate by a wafer bond connection, and the dielectric inorganic substrate has a thickness of at least 50 µm.

In Example 2, the subject matter of Example 1 can optionally include wherein a leadframe comprising a first leadframe pad and a second leadframe pad; and the semiconductor device, wherein the dielectric inorganic substrate is bonded to the leadframe, wherein the pattern of first metal structures is bonded to the first leadframe pad and the at least one second metal structure is bonded to the second leadframe pad.

In Example 3, the subject matter of Example 2 can optionally include wherein the first leadframe pad forms a low voltage terminal, in particular source terminal, of the high voltage semiconductor package and the second leadframe pad forms a control terminal, in particular gate terminal, of the high voltage semiconductor package.

In Example 4, the subject matter of Example 2 or 3 can optionally include an electrically conductive element bonded to the high voltage load electrode of the semiconductor transistor chip and connecting to a high voltage terminal of the high voltage semiconductor package.

In Example 5, the subject matter of Example 1 can optionally include wherein a laminate structure for semiconductor device embedding, wherein the semiconductor device is embedded in the laminate structure.

In Example 6, the subject matter of Example 5 can optionally include wherein the laminate structure is a printed circuit board.

In Example 7, the subject matter of Example 5 or 6 can optionally include wherein the laminate structure is a core laminate structure, the high voltage semiconductor package further comprising a bottom laminate structure extending below the core laminate structure and the semiconductor device; and/or a top laminate structure extending above the core laminate structure and the semiconductor device.

In Example 8, the subject matter of any of the preceding Examples can optionally include wherein the dielectric inorganic substrate is a glass substrate.

In Example 9, the subject matter of Example 8 can optionally include wherein the wafer bond connection is a glass frit connection.

In Example 10, the subject matter of any of the preceding Examples can optionally include wherein the first metal structures are connected to the low voltage load electrode by a metal-to-metal wafer bond connection, and/or the second metal structure is connected to the control electrode by a metal-to-metal wafer bond connection.

In Example 11, the subject matter of any of the preceding Examples can optionally include wherein the dielectric inorganic substrate comprises a plurality of stacked dielectric inorganic substrate layers.

In Example 12, the subject matter of any of the preceding Examples can optionally include wherein the first metal structures are plated metal pillars.

In Example 13, the subject matter of any of the preceding Examples can optionally include wherein the pattern is a regular array.

In Example 14, the subject matter of any of the preceding Examples can optionally include wherein a ratio of a distance between adjacent first metal structures and a lateral dimension (e.g. diameter) of a first metal structure is equal to or less than 5 or 3 or 2 or 1.

In Example 15, the subject matter of any of the preceding Examples can optionally include wherein the front side of the semiconductor transistor chip is completely covered by the dielectric inorganic substrate.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A high voltage semiconductor package, comprising:
    a semiconductor device comprising:
        a high voltage semiconductor transistor chip comprising a front side and a backside, wherein a low voltage load electrode and a control electrode are disposed on the front side of the semiconductor transistor chip and a high voltage load electrode is disposed on the backside of the semiconductor transistor chip;
        a dielectric inorganic substrate comprising:
            a pattern of first metal structures running through the dielectric inorganic substrate and connected to the low voltage load electrode; and
            at least one second metal structure running through the dielectric inorganic substrate and connected to the control electrode,
        wherein the front side of the semiconductor transistor chip is attached to the dielectric inorganic substrate by a wafer bond connection, and
        wherein the dielectric inorganic substrate has a thickness of at least 50 μm.

2. The high voltage semiconductor package of claim 1, further comprising:
    a leadframe comprising a first leadframe pad and a second leadframe pad,
    wherein the dielectric inorganic substrate is bonded to the leadframe,
    wherein the pattern of first metal structures is bonded to the first leadframe pad and the at least one second metal structure is bonded to the second leadframe pad.

3. The high voltage semiconductor package of claim 2, wherein the first leadframe pad forms a source terminal of the high voltage semiconductor package and the second leadframe pad forms a gate terminal of the high voltage semiconductor package.

4. The high voltage semiconductor package of claim 2, further comprising:
    an electrically conductive element bonded to the high voltage load electrode of the semiconductor transistor chip and connecting to a high voltage terminal of the high voltage semiconductor package.

5. The high voltage semiconductor package of claim 1, further comprising:
    a laminate structure in which the semiconductor device is embedded.

6. The high voltage semiconductor package of claim 5, wherein the laminate structure is a printed circuit board.

7. The high voltage semiconductor package of claim 5, wherein the laminate structure is a core laminate structure, the high voltage semiconductor package further comprising:
    a bottom laminate structure extending below the core laminate structure and the semiconductor device; and/or
    a top laminate structure extending above the core laminate structure and the semiconductor device.

8. The high voltage semiconductor package of claim 1, wherein the dielectric inorganic substrate is a glass substrate.

9. The high voltage semiconductor package of claim 8, wherein the wafer bond connection is a glass frit connection.

10. The high voltage semiconductor package of claim 1, wherein the first metal structures are connected to the low voltage load electrode by a metal-to-metal wafer bond connection, and/or the at least one second metal structure is connected to the control electrode by a metal-to-metal wafer bond connection.

11. The high voltage semiconductor package of claim 1, wherein the dielectric inorganic substrate comprises a plurality of stacked dielectric inorganic substrate layers.

12. The high voltage semiconductor package of claim 1, wherein the first metal structures are plated metal pillars.

13. The high voltage semiconductor package of claim 1, wherein the pattern is a regular array.

14. The high voltage semiconductor package of claim 1, wherein a ratio of a distance between adjacent first metal structures and a lateral dimension of a first metal structure is equal to or less than 5 or 3 or 2 or 1.

15. The high voltage semiconductor package of claim 1, wherein the front side of the semiconductor transistor chip is completely covered by the dielectric inorganic substrate.

* * * * *